(12) United States Patent
Suzumura et al.

(10) Patent No.: US 12,100,709 B2
(45) Date of Patent: Sep. 24, 2024

(54) DISPLAY DEVICE

(71) Applicant: Japan Display Inc., Tokyo (JP)

(72) Inventors: Isao Suzumura, Tokyo (JP); Kazufumi Watabe, Tokyo (JP); Yoshinori Ishii, Tokyo (JP); Hidekazu Miyake, Tokyo (JP); Yohei Yamaguchi, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 18/480,552

(22) Filed: Oct. 4, 2023

(65) Prior Publication Data

US 2024/0030226 A1 Jan. 25, 2024

Related U.S. Application Data

(63) Continuation of application No. 17/983,481, filed on Nov. 9, 2022, now Pat. No. 11,810,921, which is a (Continued)

(30) Foreign Application Priority Data

May 19, 2016 (JP) ................................. 2016-100493

(51) Int. Cl.
   *H01L 27/12*    (2006.01)
   *G02F 1/133*   (2006.01)
   (Continued)

(52) U.S. Cl.
   CPC ...... *H01L 27/1225* (2013.01); *G02F 1/13306* (2013.01); *G02F 1/136209* (2013.01); *G02F 1/1368* (2013.01); *H01L 27/1251* (2013.01); *H01L 27/1259* (2013.01); *H01L 29/24* (2013.01); *H01L 29/41733* (2013.01); *H01L 29/42384* (2013.01); *H01L 29/4908* (2013.01); *H01L 29/517* (2013.01); *H01L 29/78633* (2013.01); *H01L 29/78675* (2013.01);
   (Continued)

(58) Field of Classification Search
   CPC ............. H01L 27/1225; H01L 27/1251; H01L 27/1259; H01L 29/24; H01L 29/41733; H01L 29/42384; H01L 29/4908; H01L 29/517; H01L 29/78633; H01L 29/78675; H01L 29/7869; H01L 27/3262; H01L 29/78693; G02F 1/13306; G02F 1/136209; G02F 1/1368; G02F 1/13685; G02F 2202/10; G02F 2202/104
   See application file for complete search history.

(56) References Cited

U.S. PATENT DOCUMENTS

| 2007/0152217 A1* | 7/2007 | Lai ...................... H01L 27/1225 438/149 |
| 2010/0182223 A1* | 7/2010 | Choi .................... G09G 3/3233 345/76 |

* cited by examiner

*Primary Examiner* — David Vu
(74) *Attorney, Agent, or Firm* — Michael Best & Friedrich LLP

(57) ABSTRACT

The object of the present invention is to make it possible to form an LTPS TFT and an oxide semiconductor TFT on the same substrate. A display device includes a substrate having a display region in which pixels are formed. The pixel includes a first TFT using an oxide semiconductor 109. An oxide film 110 as an insulating material is formed on the oxide semiconductor 109. A gate electrode 111 is formed on the oxide film 110. A first electrode 115 is connected to a drain of the first TFT via a first through hole formed in the oxide film 110. A second electrode 116 is connected to a source of the first TFT via a second through hole formed in the oxide film 110.

7 Claims, 14 Drawing Sheets

Related U.S. Application Data continuation of application No. 17/336,620, filed on Jun. 2, 2021, now Pat. No. 11,521,990, which is a continuation of application No. 16/743,080, filed on Jan. 15, 2020, now Pat. No. 11,049,882, which is a continuation of application No. 16/011,725, filed on Jun. 19, 2018, now Pat. No. 10,573,666, which is a continuation of application No. 15/585,401, filed on May 3, 2017, now Pat. No. 10,026,754.

(51) Int. Cl.
| | | |
|---|---|---|
| *G02F 1/1362* | (2006.01) | |
| *G02F 1/1368* | (2006.01) | |
| *H01L 29/24* | (2006.01) | |
| *H01L 29/417* | (2006.01) | |
| *H01L 29/423* | (2006.01) | |
| *H01L 29/49* | (2006.01) | |
| *H01L 29/51* | (2006.01) | |
| *H01L 29/786* | (2006.01) | |
| *H10K 59/121* | (2023.01) | |

(52) U.S. Cl.
CPC ...... *H01L 29/7869* (2013.01); *G02F 1/13685* (2021.01); *G02F 2202/10* (2013.01); *G02F 2202/104* (2013.01); *H10K 59/1213* (2023.02)

FIG. 14

| No. | SAMPLE | Al,O COMPOSITION RATIO (atm %) | | | Al,O CHEMICAL BOND STATUS | | REFRACTIVE INDEX | STRESS |
|---|---|---|---|---|---|---|---|---|
| | | Al | O | Al/O | Al | O | | |
| 1 | SAMPLE A | 36.62 | 63.38 | 1.73 | Al-O | O A, OH, O (WATER) SLIGHTLY HIGH CONTENT | 1.569 | COMPRESSIVE |
| 2 | SAMPLE B | 36.45 | 63.55 | 1.74 | Al-O | O A, OH, O (WATER) SLIGHTLY HIGH CONTENT | 1.568 | TENSILE |
| 3 | SAMPLE C | 38.93 | 61.07 | 1.57 | Al-O | O A, OH, O (WATER) | 1.62 | COMPRESSIVE |

DISPLAY DEVICE

CROSS-REFERENCE TO RELATED APPLICATIONS

This application is a continuation of U.S. application Ser. No. 17/983,481 filed on Nov. 9, 2022, which, in turn, is a continuation of U.S. application Ser. No. 17/336,620 (now U.S. Pat. No. 11,521,990) filed on Jun. 2, 2021, which, in turn, is a continuation of U.S. application Ser. No. 16/743,080 (now U.S. Pat. No. 11,049,882) filed on Jan. 15, 2020, which, in turn, is a continuation of U.S. application Ser. No. 16/011,725 (now U.S. Pat. No. 10,573,666) filed on Jun. 19, 2018, which, in turn, is a continuation of U.S. application Ser. No. 15/585,401 (now U.S. Pat. No. 10,026,754) filed on May 3, 2017. Further, this application claims priority from Japanese Patent Application JP 2016-100493 filed on May 19, 2016, the entire contents of which are hereby incorporated by reference into this application.

BACKGROUND OF THE INVENTION

1. Field of the Invention

The present invention relates to a display device, and in particular, to a display device employing hybrid structure formed of both a TFT using poly-Si and a TFT using an oxide semiconductor.

2. Description of the Related Art

In a liquid crystal display device, a TFT substrate on which pixels each having pixel electrodes, a thin-film transistor (TFT), etc. are formed like a matrix and a counter substrate are arranged to face each other and a liquid crystal is sandwiched between the TFT substrate and the counter substrate. The liquid crystal display device forms an image by controlling the light transmittance of liquid crystal molecules in regard to each pixel. On the other hand, an organic electroluminescence (EL) display device forms a color image by use of a self-luminous organic EL layer and a TFT that are arranged in each pixel. The organic EL display device needs no backlight, and thus is advantageous for the thinning of the device.

Low temperature poly-Si (LTPS) has high carrier mobility and thus is suitable as a TFT for a drive circuit. In contrast, oxide semiconductors have high OFF resistance, and the OFF current of a TFT can be reduced by using an oxide semiconductor for the TFT.

JP-A-2013-175718 and JP-A-2011-54812 can be taken as examples of prior art literature having a description of a TFT using an oxide semiconductor. JP-A-2013-175718 describes a configuration in which metallic oxide is formed on an oxide semiconductor constituting the channel and is used as a gate insulation film. JP-A-2011-54812 describes the use of a metallic oxide layer or a semiconductor layer as a sacrificial layer for channel etching in a bottom-type TFT using an oxide semiconductor

SUMMARY OF THE INVENTION

The TFT used for the switching of a pixel is required to keep down its leak current. The use of an oxide semiconductor for the TFT can reduce the leak current. In the following description, a type of oxide semiconductor that is optically transparent and not crystalline will be referred to as TAOS (transparent amorphous oxide semiconductor). Examples of TAOS include indium gallium zinc oxide (IGZO), indium tin zinc oxide (ITZO), zinc oxide nitride (ZnON), indium gallium oxide (IGO), and so forth. However, TAOS has low carrier mobility, and thus there are cases where it is difficult to form a drive circuit to be installed in a display device with TFTs using TAOS. The term "TAOS" will hereinafter be used also in the meaning of a TFT using TAOS.

In contrast, a TFT formed with LTPS has high carrier mobility, and thus the drive circuit can be formed with TFTs using LTPS. The term "LTPS" will hereinafter be used also in the meaning of a TFT using LTPS. However, in cases where LTPS is used for a switching TFT in a pixel, two LTPSs are usually used in series connection since LIPS has high leak current.

Therefore, it is rational to use TAOS as the switching element of each pixel in the display region and LIPS as each TFT of a peripheral drive circuit. However, LIPS and TAOS have material characteristics different from each other and there is a problem in forming them on the same substrate. Specifically, in cases where a source electrode and a drain electrode are formed on LIPS, the LIPS has to be cleaned with hydrofluoric acid (HF) in order to remove surface oxide. However, it is impossible to use the same process for TAOS since TAOS is dissolved by hydrofluoric acid (HF).

The object of the present invention is to resolve the above-described problem and thereby make it possible to form a TFT made with LIPS and a TFT made with TAOS on the same substrate.

Means for Solving the Problems

Examples of specific means of the present invention, overcoming the above-described problem, are as follows:

(1) A display device including a substrate having a display region in which pixels are formed. In the display device, the pixel includes a first TFT using an oxide semiconductor, an oxide film as an insulating material is formed on the oxide semiconductor, a gate electrode is formed on the oxide film, a first electrode is connected to a drain of the first TFT via a first through hole formed in the oxide film, and a second electrode is connected to a source of the first TFT via a second through hole formed in the oxide film.

(2) The display device according to (1), in which a wall of the through hole formed in the oxide film has a first taper $\theta 1$ on a side opposite to the oxide semiconductor and a second taper $\theta 2 < \theta 1$ on the oxide semiconductor's side.

(3) The display device according to (1), wherein the oxide film is AlOx.

BRIEF DESCRIPTION OF THE DRAWINGS

FIG. 14 is a table showing specifications of samples of AlOx.

DESCRIPTION OF THE PREFERRED EMBODIMENTS

The contents of the present invention will be described in detail below by using some embodiments.

First Embodiment

Figure 1:
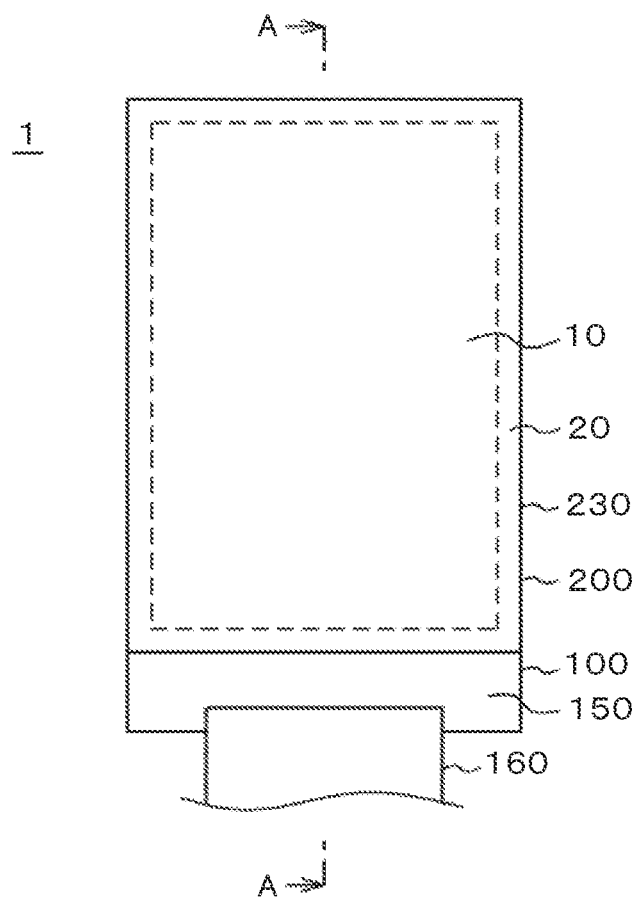
FIG. 1 is a plan view of a liquid crystal display device to which the present invention is applied.
Figure 2:
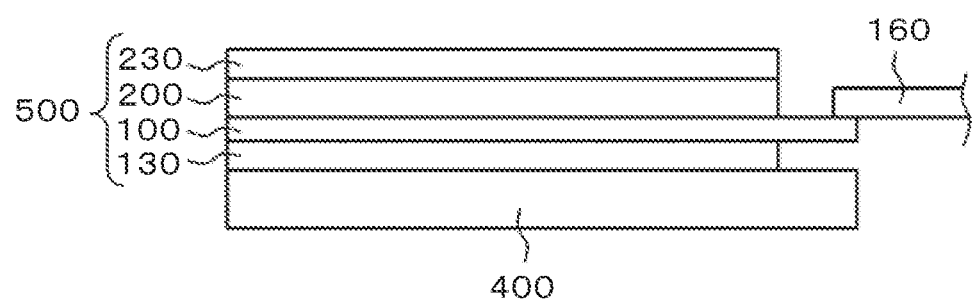
FIG. 2 is a cross-sectional view taken along the line A-A in FIG. 1.

FIG. 1 is a plan view of a liquid crystal display device to which the present invention is applied. FIG. 2 is a cross-sectional view taken along the line A-A in FIG. 1. In FIGS. 1 and 2, a TFT substrate 100 and a counter substrate 200 are formed to face each other and a liquid crystal is sandwiched between the TFT substrate 100 and the counter substrate 200. A lower polarizing plate 130 is bonded to a lower surface of the TFT substrate 100, while an upper polarizing plate 230 is bonded to an upper surface of the counter substrate 200. The combination of the TFT substrate 100, the counter substrate 200, the lower polarizing plate 130 and the upper polarizing plate 230 will be referred to as a liquid crystal display panel 500.

The TFT substrate 100 is formed to be larger than the counter substrate 200. A part of the TFT substrate 100 not paired with the counter substrate 200 is formed as a terminal unit 150, to which a flexible wiring board 160 for supplying signals and electric power from the outside to the liquid crystal display device is connected. The liquid crystal display panel 500 is not self-luminous, and thus a backlight 400 is arranged on the back of the liquid crystal display panel 500.

The liquid crystal display device can be divided into a display region 10 and a peripheral region 20 as shown in FIG. 1. In the display region 10, a great number of pixels are formed like a matrix, and each pixel includes a switching TFT. In the peripheral region 20, a drive circuit for driving scan lines, image signal lines, etc. is formed.

The TFTs used for the pixels are required to keep down their leak current and thus it is rational to use TAOS for these TFTs, while the TFTs used for the peripheral drive circuit are required to have high carrier mobility and thus it is rational to use LIPS for these TFTs. In cases where the LIPS is connected to a drain electrode or a source electrode in an LIPS process, it is necessary to form a through hole through an insulation film covering the LIPS and also perform the cleaning with hydrofluoric acid (HF) in order to remove surface oxide on the LIPS in the through hole.

Figure 7:
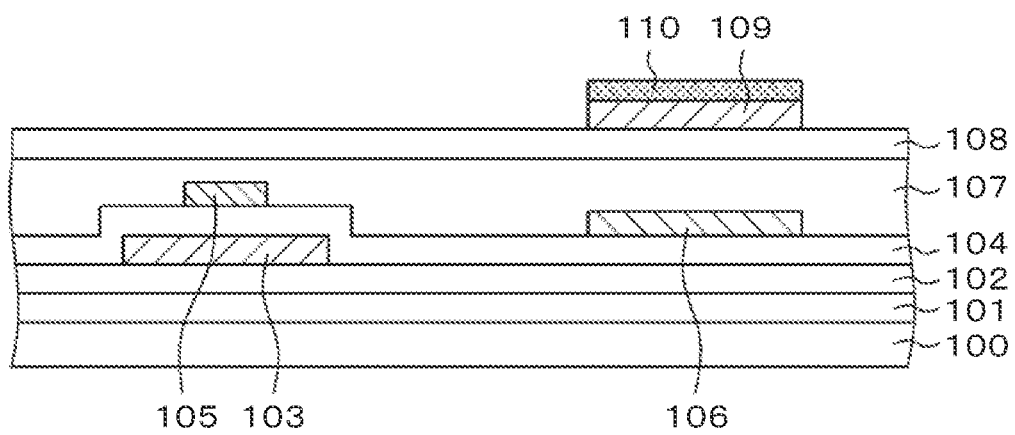
FIG. 7 is a cross-sectional view showing a fifth production step according to the present invention.
Figure 8:
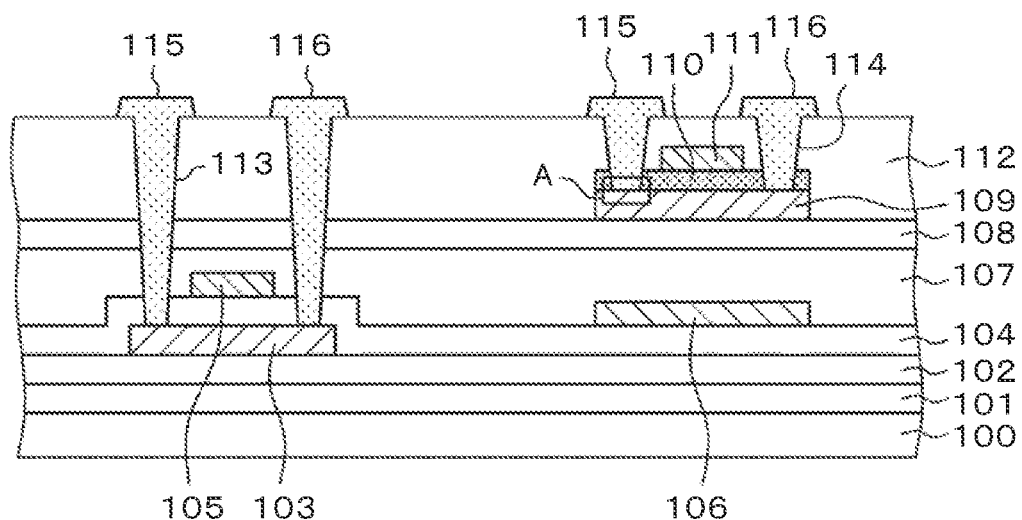
FIG. 8 is a cross-sectional view showing characteristics of the present invention.

However, if the same process is applied to the TFTs using TAOS, the TAOS is dissolved by hydrofluoric acid (HF) and the TFTs cannot be formed. Therefore, this problem has to be resolved in order to form TFTs made with LIPS and TFTs made with TAOS on the same substrate. FIG. 8 shows a configuration according to the present invention that resolves this problem. FIGS. 3 to 7 show a process implementing the configuration of FIG. 8.

Figure 3:
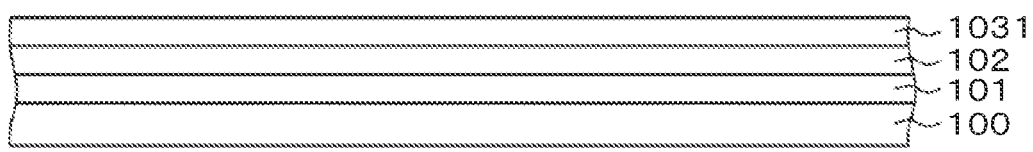
FIG. 3 is a cross-sectional view showing a first production step according to the present invention.

In FIG. 3, a first base film 101 and a second base film 102 are successively formed on the TFT substrate 100 made with glass, and amorphous Si (a-Si) 1031 is formed on the second base film 102. The first base film 101 is formed with silicon nitride SiNx, for example, and the second base film 102 is formed with silicon oxide SiOx. The first base film 101 and the second base film 102 prevent a semiconductor layer from being contaminated by impurities contained in glass. The a-Si 1031 is formed on the second base film 102 up to a thickness of approximately 50 nm. The first base film 101, the second base film 102 and the a-Si 1031 are formed successively by means of chemical vapor deposition (CVD).

Figure 4:
FIG. 4 is a cross-sectional view showing a second production step according to the present invention.
Figure 5:
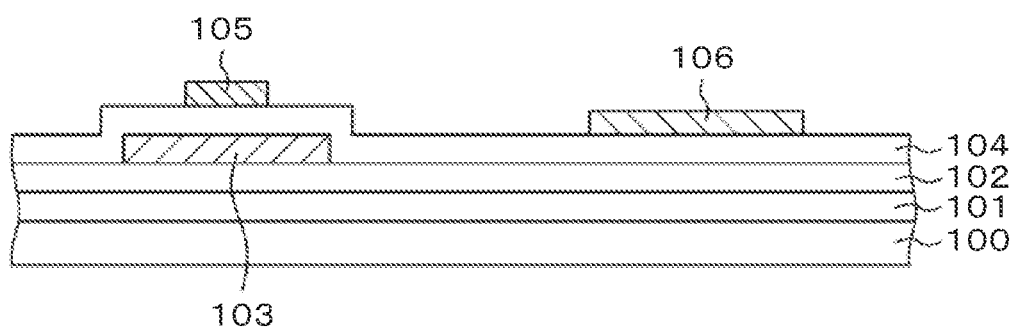
FIG. 5 is a cross-sectional view showing a third production step according to the present invention.

Thereafter, the a-Si 1031 is irradiated with an excimer laser and thereby transformed into poly-Si 103. FIG. 4 is a cross-sectional view showing a state in which the patterning of a semiconductor layer 103 transformed into the poly-Si 103 is finished. The poly-Si will hereinafter be referred to as LTPS 103.

A gate insulation film 104 is formed to cover the LTPS 103. The gate insulation film 104 is a SiOx film formed by CVD by using tetraethoxysilane (TEOS) as the raw material. A gate electrode 105 is formed on the gate insulation film 104. The gate electrode 105 is formed with Al alloy, Mo, W, or a laminated film of some of these materials, or the like.

In FIGS. 5 to 8, the TFT using TAOS is shown in a right-hand part of the drawing. In the region where the TAOS TFT is formed, a light blocking film 106 is formed concurrently with the gate electrode 105. This is because TAOS is scheduled to be formed in the display region to be exposed to light from the backlight and thus it is necessary to prevent inflow of photocurrent into TAOS. Parenthetically, in cases where an LTPS TFT is used for the display region, it is desirable to form a light blocking film under the first base film 101. Metal constituting the gate electrode 105 or the light blocking film 106 is formed by sputtering and thereafter patterned by photolithography.

Figure 6:
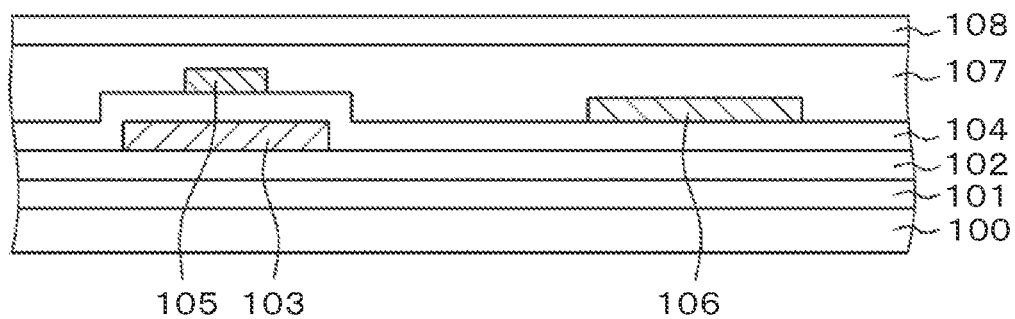
FIG. 6 is a cross-sectional view showing a fourth production step according to the present invention.

Thereafter, as shown in FIG. 6, a first interlayer insulation film 107 is formed with SiNx to cover the gate electrode 105 and the light blocking film 106, and a second interlayer insulation film 108 of SiOx is formed on the first interlayer insulation film 107. While the first and second interlayer insulation films 107 and 108 are formed for the insulation between a TAOS layer 109 and the gate electrode 105 or the light blocking film 106, the first and second interlayer insulation films 107 and 108 function also as base films for the TAOS layer 109.

The TAOS layer 109 is formed on the second interlayer insulation film 108, and a sacrificial layer 110 is formed on the TAOS layer 109 with aluminum oxide AlOx, for example. Thereafter, the TAOS layer 109 and the sacrificial layer 110 are patterned as shown in FIG. 7. The TAOS 109 is formed with IGZO, ITZO, IGO or the like or alloy of some of these materials, for example. The thickness of the TAOS 109 is 10 to 100 nm, for example.

The sacrificial layer 110 is desired to be formed with oxide, specifically, AlOx, and the thickness of the sacrificial layer 110 is desired to be 5 to 50 nm. If the film thickness of the sacrificial layer 110 is too small, the sacrificial layer 110 can becomes discontinuous and hydrofluoric acid can permeate into the TAOS 109. Conversely, if the sacrificial layer 110 is thick, the formation of the sacrificial layer 110 takes a long time, or the TFT becomes likely to fall into depletion.

On the other hand, the etching rate of AlOx used for the sacrificial layer 110 varies greatly depending on the film quality. Therefore, the determination of the appropriate film thickness of the sacrificial layer 110 has to be made in consideration of the relationship with the etching rate. The duration of the cleaning of the LTPS 103 with hydrofluoric acid is 30 seconds or less. Thus, the film thickness of the sacrificial layer 110 required in consideration of the approximately 30 seconds of cleaning is shown in the following Table 1:

TABLE 1

| Etching rate of 0.5% DHF of sacrificial layer (nm/min) | Film thickness of sacrificial layer required (nm) |
|---|---|
| 2 | 1 |
| 4 | 2 |
| 10 | 5 |
| 50 | 25 |
| 100 | 50 |
| 150 | 75 |
| 200 | 100 |

Table 1 shows evaluation of the etching rate of 0.5% diluted hydrofluoric acid used for the cleaning of the through holes 113 of the LTPS 103. As shown in Table 1, the appropriate film thickness of the sacrificial layer 110 is approximately 5 to 50 nm in consideration of the deposition rate of the sacrificial layer, resistance to the etching solution, etc. Incidentally, the sacrificial layer 110 may be formed as some separate layers. By employing such a multilayer film, the formation of film defects by foreign substances can be restrained.

The patterning of the sacrificial layer 110 and the TAOS 109 is performed by Cl-based dry etching or wet etching by use of oxalic acid, a developing solution, or the like. Since the sacrificial layer 110 and the TAOS 109 are patterned at the same time, it is desirable to avoid the use of an etching solution having extremely high etching rate only for the TAOS 109.

Thereafter, as shown in FIG. 8, a gate electrode 111 for the TAOS TFT is formed on the sacrificial layer 110. The gate electrode 111 is formed by the same method as the gate electrode 105. Specifically, metal to become the gate electrode 111 is deposited by sputtering and thereafter patterned. In the configuration shown in FIG. 8, the sacrificial layer 110 made with AlOx constitutes a gate insulation film.

An inorganic passivation film 112 is formed to cover the TAOS 109, the sacrificial layer 110 and the gate electrode 111. Thereafter, as shown in FIG. 8, the through holes 113 for forming the drain electrode and the source electrode on the TFT made with LTPS 103 is formed to penetrate the inorganic passivation film 112, the second interlayer insulation film 108, the first interlayer insulation film 107 and the gate insulation film 104. Further, through holes 114 for forming the drain electrode and the source electrode on the TFT made with TAOS 109 are formed through the inorganic passivation film 112 and the sacrificial layer 110. The through holes 113 and the through holes 114 are formed concurrently by dry etching.

The dry etching is carried out by using CF-based gas (CF4) or CHF-based gas (CHF3). The etching rate of the dry etching is 70 nm/min for SiOx and 6 nm/min for AlOx, for example, and is extremely low for AlOx in comparison with SiOx. Therefore, even though the dry etching for the through holes 113 on the LTPS's side are carried out through four layers and the dry etching for the through holes 114 on the TAOS's side are carried out through only two layers, AlOx remains on the through holes 114's side and the function as the sacrificial layer 110 can be maintained.

In FIG. 8, while the through holes 113 on the LIPS 103's side are cleaned with hydrofluoric acid, the through holes 114 on the TAOS 109's side are also cleaned with hydrofluoric acid at the same time. In the present invention, AlOx remains on the through holes 114 on the TAOS 109's side, and thus hydrofluoric acid does not make contact with the TAOS 109 and destruction of the TFT on the TAOS 109's side is avoided.

The Etching rate by using 5% hydrofluoric acid is 4 to 14 nm/min for AlOx, 6000 nm/min or higher for IGZO, 480 nm/min for ITZO, and 0 nm/min for poly-IGO. Although poly-IGO is hardly etched, this is a value in cases where poly-IGO is a bulk crystal. When poly-IGO is in a thin film state, hydrofluoric acid can permeate through the grain boundary and destroy the TAOS 109.

Figure 9:
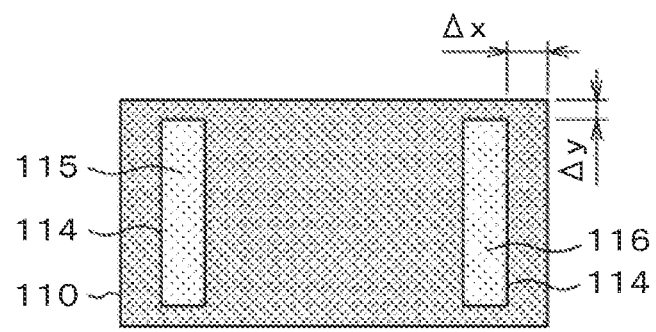
FIG. 9 is a plan view of a sacrificial layer.

FIG. 9 is a plan view of the sacrificial layer 110. The through hole 114 is formed on the left-hand and right-hand sides of the sacrificial layer 110, and a drain electrode 115 and a source electrode 116 are formed respectively in the through holes 114 on the left-hand and right-hand sides. The through holes 114 for forming the drain electrode 115 and the source electrode 116 are formed Δx and Δy inside the edges of the sacrificial layer 110. This is for preventing hydrofluoric acid from reaching the TAOS layer 109 via the periphery of the sacrificial layer 110 and dissolving the TAOS layer 109 in the etching by use of hydrofluoric acid.

Figure 10:
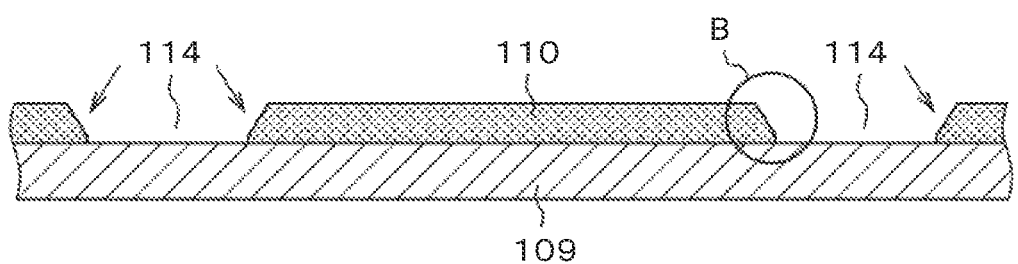
FIG. 10 is a cross-sectional view showing the shape of a through hole in the sacrificial layer.
Figure 11:
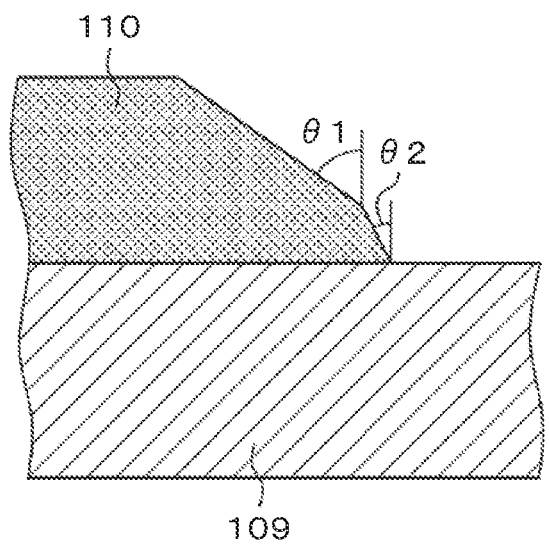
FIG. 11 is a cross-sectional view showing details of the shape of the through hole in the sacrificial layer.

The region indicated by the reference character A in FIG. 8, that is, the cross-sectional shape of the through hole 114 formed in the sacrificial layer 110, is important. FIG. 10 is a cross-sectional view of the through hole 114 in the sacrificial layer 110 corresponding to the region A in FIG. 8. As shown in FIG. 10, the through hole 114 is tapered in two stages. The taper angle of the through hole 114 in the sacrificial layer 110 is larger on the upper surface's side of the sacrificial layer 110 than on the TAOS 109's side. FIG. 11 is an enlarged sectional view of the part B in FIG. 10, indicating the definition of the taper angle. In FIG. 11, the taper angle θ1 of the through hole on the upper surface's side of the sacrificial layer 110 is larger than the taper angle θ2 on the TAOS 109's side.

Figure 12:
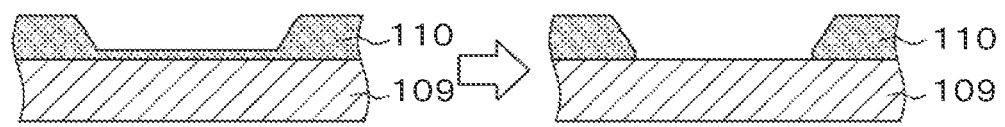
FIG. 12 is a cross-sectional view showing a process of two-stage etching.

This is the result of the two-stage etching for forming the through holes 114. The process of the two-stage etching is shown in FIG. 12. The left-hand side of FIG. 12 shows the state after the hydrofluoric acid cleaning. This corresponds to a first-stage etching. Thereafter, as shown in the right-hand side of FIG. 12, a second-stage etching is carried out by using an aqueous solution of tetramethylammonium hydroxide (TMAH).

TMAH is used generally as a developing solution. The etching rate of AlOx by use of TMAH is as low as 7 nm/min. Further, even when over-etching continues for a relatively long time, the decrease in TAOS 109 can be kept down to an extremely small amount. The two-stage etching is made possible by properly setting the thickness of the AlOx sacrificial layer 110. Incidentally, the etching solution for the two-stage etching is not limited to TMAH; a different etching solution is also usable as long as its etching rate for AlOx is lower than that of hydrofluoric acid.

Figure 13:
FIG. 13 is a cross-sectional view showing a problem arising when etching is carried out by using hydrofluoric acid alone.

In contrast, if the sacrificial layer 110 is etched by using hydrofluoric acid alone, eaves of the sacrificial layer 110 are formed in the through hole as shown in FIG. 13 due to the great etching rate difference between the sacrificial layer 110 and the TAOS 109. If the through hole is formed in such a shape, problems arise such as poor electrical contact at the drain or the source and a drop in the reliability of the TAOS TFT.

FIG. 14 is a table showing film quality and characteristics of each type of AlOx used as the sacrificial layer 110. The samples A, B and C differ from each other in the composition ratio of AlOx, that is, the ratio O/Al. For the three types of AlOx, evaluation of chemical bond status of Al and O, the refractive index and the film stress is summarized in the table. The samples A and B have a slightly high water content in AlOx in comparison with the sample C.

A characteristic feature of AlOx found in FIG. 14 is that only a slight change in the composition ratio leads to a change in the film stress of AlOx from compressive stress to tensile stress. On the other hand, the refractive index increases with the increase in the compactness of the film. Thus, the sample C can be evaluated as a compact film.

Figure 15:
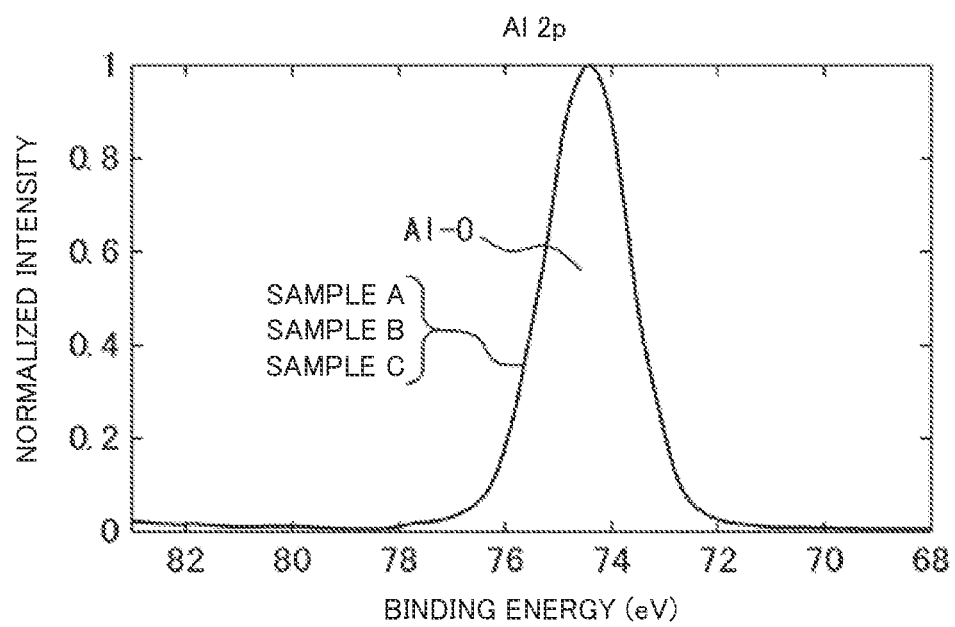
FIG. 15 is a graph showing binding energy of an Al atom.
Figure 16:
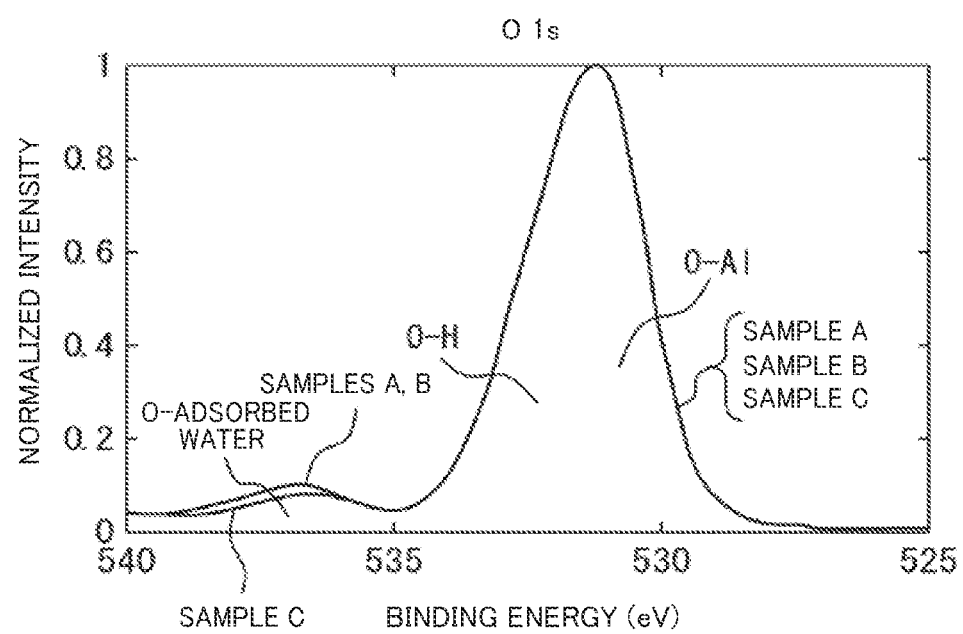
FIG. 16 is a graph showing binding energy of an oxygen atom.

The compactness of the film is influenced by the water content. FIGS. 15 and 16 show the result of X-ray photoelectron spectroscopy (XPS) measurement of the samples. In FIGS. 15 and 16, the horizontal axis represents the binding energy and the vertical axis represents the number of electrons emitted at each level of energy.

FIG. 15 shows the result of measurement of the binding energy between an Al atom and oxygen in regard to an electron in the 2p orbital of the Al atom. In this regard, the three samples exhibited substantially the same characteristics as shown in FIG. 15.

FIG. 16 shows the result of measurement in regard to an electron in the is orbital of O. The three samples exhibited substantially the same results in regard to the O—Al bond and the O—H bond, whereas the magnitude of the binding energy deriving from water indicated by "O-ADSORBED WATER" is low in the sample C compared to the samples A and B. This indicates a low water content in AlOx.

In the experimental result, the sample C, having a low water content and a high refractive index, proved to exhibit stable characteristics required of the sacrificial layer 110. Corresponding to this result, the refractive index of AlOx used as the sacrificial layer 110 is desired to be in a range from 1.58 to 1.65. Incidentally, the film stress of AlOx changes greatly depending on a slight change in the composition ratio between Al and O or the water content as shown in FIG. 14. It is also possible to use these characteristics for the adjustment of the film stress.

The following Table 2 shows examples of the combination of the TAOS 109 and the sacrificial layer 110. The TAOS 109 can be formed not only as a single layer but also as multiple layers. While AlOx is used for the sacrificial layer 110, formation of AlOx as multiple layers also achieves the effect of reducing film defects caused by foreign substances.

TABLE 2

| TAOS | Sacrificial layer |
| --- | --- |
| a-IGZO | a-AIOx |
| a-IGZO\a-IGZO (low Zn) | a-AIOx |
| a-IGZO\a-ITZO | a-AIOx |
| a-IGZO\a-IGO | a-AIOx |
| a-IGZO | a-AIOx having orientation |
| IGZO having orientation | a-AIOx |
| IGZO having orientation | a-AIOx etc. having orientation |

While the "orientation" in Table 2 is synonymous with crystallinity, in the TAOS 109 and the sacrificial layer 110 both being thin films, a crystal does not grow in the film thickness direction and the crystal growth occurs only in film surface directions. The term "orientation" is used to express this situation.

As described above, by use of the present invention, even when the through holes 113 on the LTPS 103's side are cleaned with hydrofluoric acid, the destruction of a TFT does not occur at the through holes 114 on the TAOS 109's side, and thus it becomes possible to form TFTs made with LTPS 103 and TFTs made with TAOS 109 on the same substrate. Accordingly, a display device of high image quality and high reliability can be realized.

Second Embodiment

Figure 17:
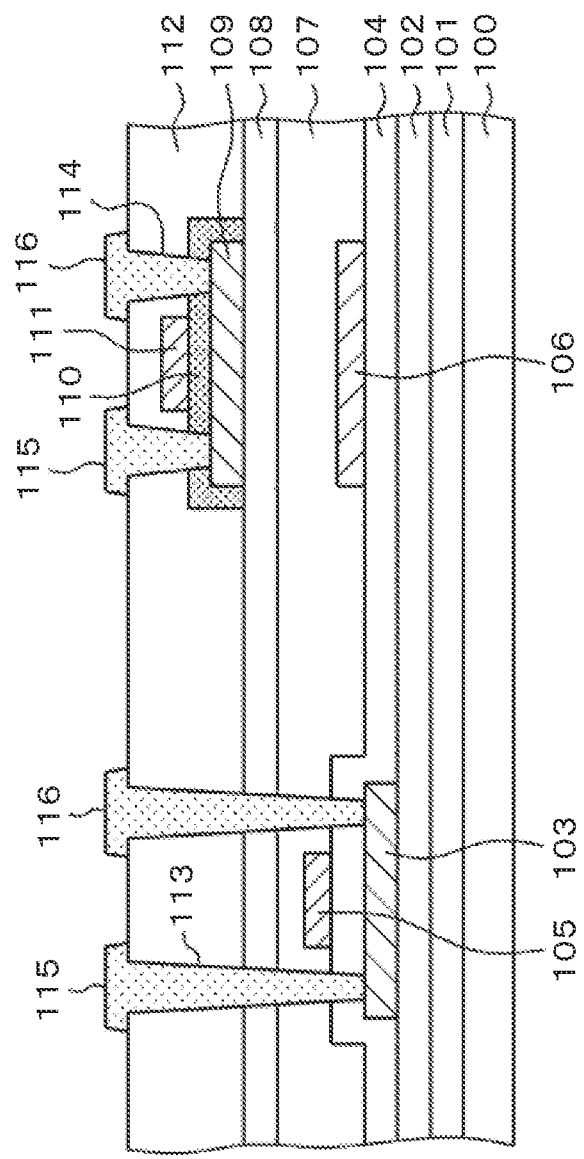
FIG. 17 is a cross-sectional view showing the configuration of TFTs according to a second embodiment of the present invention.

FIG. 17 is a cross-sectional view showing a second embodiment of the present invention. FIG. 17 differs from FIG. 8 of the first embodiment in that the sacrificial layer 110 covers also the side faces of the TAOS 109. With this configuration, even when hydrofluoric acid permeates toward a side face of the TAOS 109, the side face of the TAOS 109 is protected by the sacrificial layer 110 and the influence on the TAOS 109 can be avoided.

Figure 18:
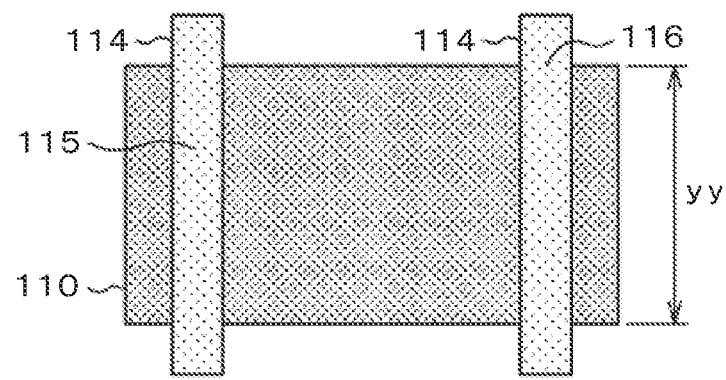
FIG. 18 is a plan view of a sacrificial layer in the second embodiment.

Consequently, as shown in FIG. 18, the width of the through holes 114 in which the drain electrode 115 and the source electrode 116 are formed can be made larger than the width yy of the sacrificial layer 110. Namely, the channel width of the TFT can be increased and the ON current can be increased.

Incidentally, while employing a configuration like FIG. 17 for the TAOS 109 and the sacrificial layer 110 leads to an increase in the number of steps, the degree of freedom of the process can be increased. Put another way, the tolerance of the process can be increased. Further, since the channel width can be increased, the TFT size can be reduced correspondingly and the pixel density can also be increased.

Third Embodiment

Figure 19:
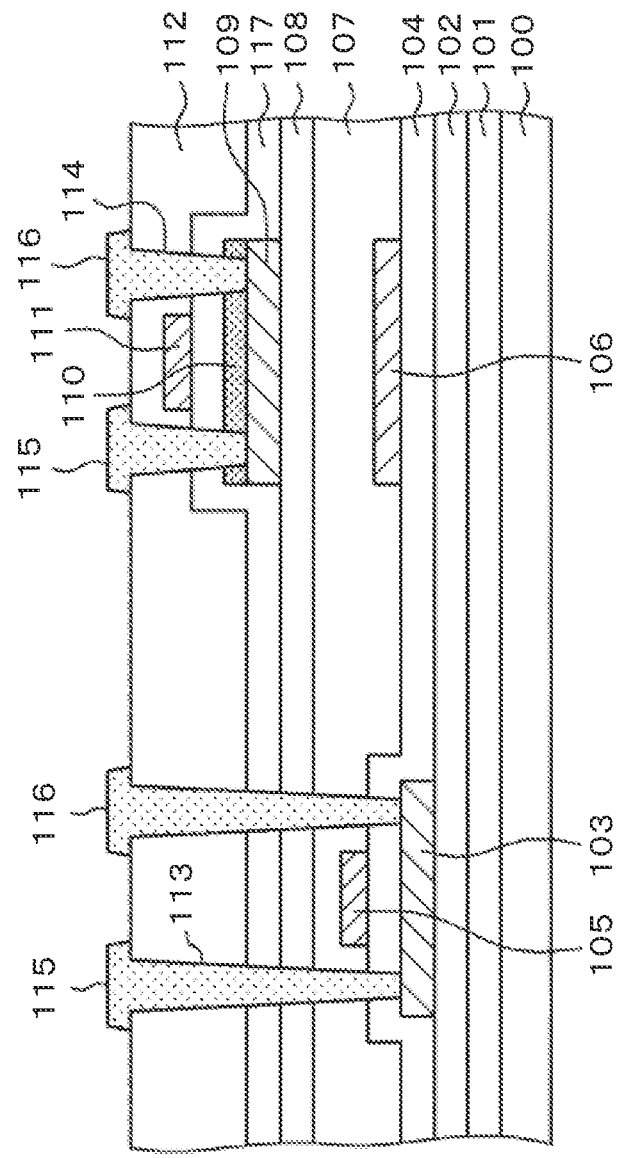
FIG. 19 is a cross-sectional view showing the configuration of TFTs according to a third embodiment of the present invention.

FIG. 19 is a cross-sectional view showing a third embodiment of the present invention. FIG. 19 differs from FIG. 8 of the first embodiment in that the gate insulation film of the TFT made with TAOS 109 is constituted of not only the sacrificial layer 110 but also a gate insulation film 117 made with SiOx. By the addition of the gate insulation film 117 made with SiOx, the degree of freedom of the film thickness of the sacrificial layer 110 made with AlOx can be increased. Put another way, it becomes possible to determine the film thickness and the film quality of the sacrificial layer 110 in consideration not of the insulation characteristic but exclusively of the threshold of the TAOS TFT and the etching characteristic of the sacrificial layer.

Fourth Embodiment

Figure 20:
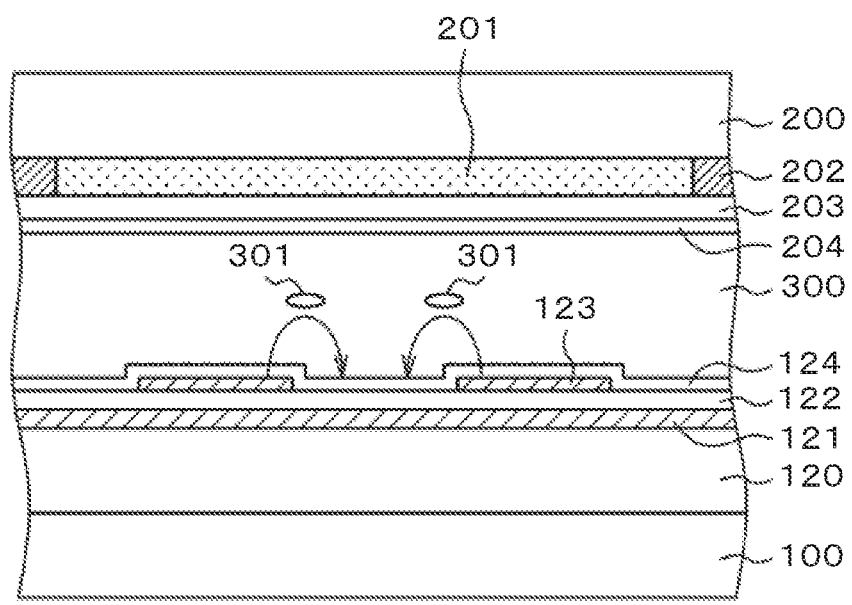
FIG. 20 is a cross-sectional view of a liquid crystal display device.

FIG. 20 is a cross-sectional view showing a case where the TFTs made with TAOS described in the first through third embodiments are employed for the display region. In FIG. 20, a TFT array layer 120 is formed on the TFT substrate 100. The TFT array layer 120 has the layered structure of the TAOS TFT shown in FIG. 8, FIG. 19 or the like. An organic passivation film is formed on the TFT array layer 120.

FIG. 20 shows an example of a liquid crystal display device of the in-plane switching (IPS) type, in which a common electrode 121 is formed in a planar shape on the TFT array layer 120. A capacitive insulation film 122 is formed to cover the common electrode 121, and pixel electrodes 123 are formed on the capacitive insulation film 122. The pixel electrodes 123 are formed in a shape like comb teeth or stripes. An alignment layer 124 for aligning liquid crystal molecules 301 in the initial alignment is formed to cover the pixel electrodes 123.

When an image signal is applied between each pixel electrode 123 and the common electrode 121, lines of electric force develop as indicated by the arrows, by which the liquid crystal molecules 301 are rotated, the transmittance of a liquid crystal layer 300 is controlled, and an image is formed.

In FIG. 20, a counter substrate 200 is arranged to sandwich the liquid crystal layer 300. The counter substrate 200 has a color filter 201 and a black matrix 202 formed thereon. An overcoat film 203 is formed to cover the color filter 201 and the black matrix 202, and an alignment layer 204 for aligning the liquid crystal molecules 301 in the initial alignment is formed on (under) the overcoat film 203.

In the liquid crystal display device, when an image signal is written to a pixel electrode 123, a voltage is held for the period of one frame by retention capacitance formed by the pixel electrode 123, the common electrode 121 and the capacitive insulation film 122. If the leak current in this period is high, the voltage of the pixel electrode 123 changes, a flicker or the like occurs, and it becomes impossible to form an excellent image. By employing the TAOS TFTs according to the present invention, a liquid crystal display device of low leak current and high image quality can be realized.

Fifth Embodiment

Figure 21:
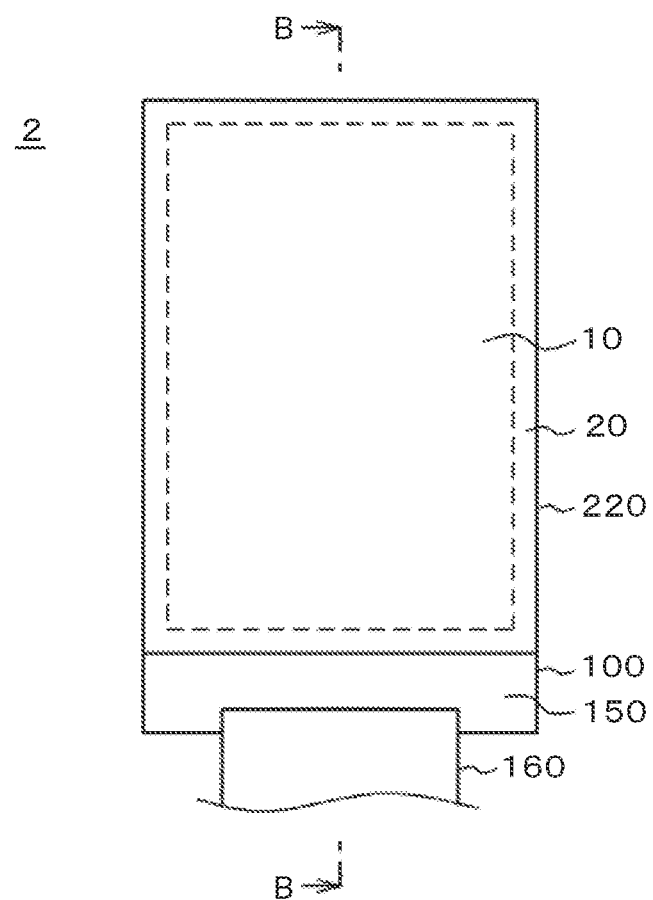
FIG. 21 is a plan view of an organic EL display device.

The combinations of LTPS TFTs and TAOS TFTs described in the first through third embodiments are applicable also to organic EL display devices. FIG. 21 is a plan view of an organic EL display device 2. In FIG. 21, a display region 10 and a peripheral circuit region 20 are formed. Organic EL drive TFTs and switching TFTs are formed in the display region 10. The TAOS TFTs with low leak current are suitable for the switching TFTs. The peripheral drive circuit, which is formed with TFTs, is formed mainly with LTPS TFTs.

In FIG. 21, an antireflective polarizing plate 220 is bonded so as to cover the display region 10. Since a reflecting electrode is formed in the organic EL display device, the antireflective polarizing plate 220 is used to restrain the reflection of external light. A terminal unit 150 is formed in a part other than the display region 10. A flexible wiring board 160 for supplying electric power and signals to the organic EL display device is connected to the terminal unit 150.

Figure 22:
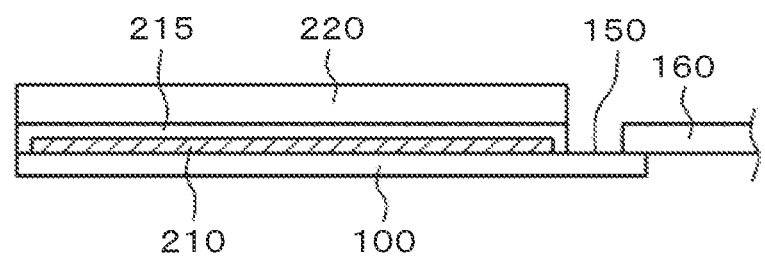
FIG. 22 is a cross-sectional view taken along the line B-B in FIG. 21.

FIG. 22 is a cross-sectional view taken along the line B-B in FIG. 21. In FIG. 22, a display element layer 210 including an organic EL layer is formed on the TFT substrate 100. The display element layer 210 is formed corresponding to the display region 10 shown in FIG. 21. Since the organic EL material is decomposed by water, a protective layer 215 covering the display element layer 210 is formed with SiNx or the like in order to prevent the entry of water from the outside. The polarizing plate 220 is bonded onto the protective layer 215. The terminal unit 150 is formed in a part other than the display element layer 210, and the flexible wiring board 160 is connected to the terminal unit 150.

Figure 23:
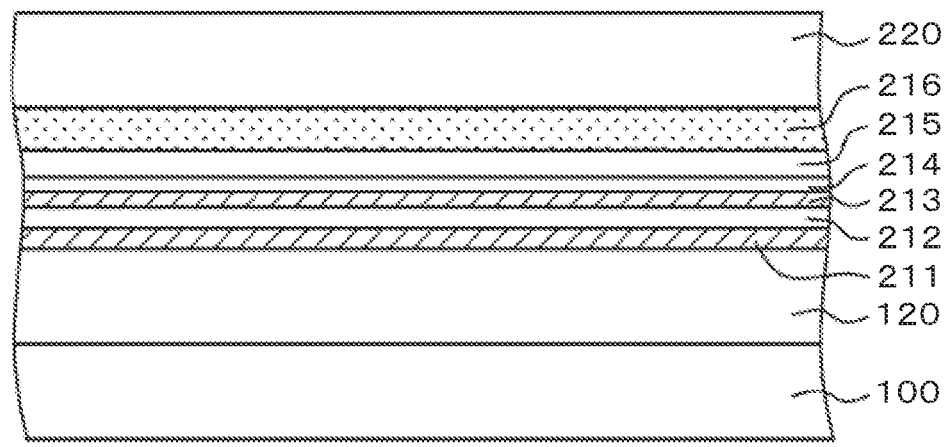
FIG. 23 is a cross-sectional view of the organic EL display device.

FIG. 23 is a cross-sectional view of the display region of the organic EL display device. In FIG. 23, the TFT array layer 120 is formed on the TFT substrate 100. The TFT array layer 120 includes the layered structure of the TAOS TFT shown in FIG. 8, FIG. 19 or the like. An organic passivation film is formed on the TFT array layer 120.

In FIG. 23, a reflecting electrode 211 is formed with Al alloy or the like on the TFT array layer 120, and a lower electrode 212 as the cathode is formed with ITO or the like on the reflecting electrode 211. Formed on the lower electrode 212 is an organic EL layer 213. The organic EL layer 213 is made up of an electron injection layer, an electron transport layer, a light emission layer, a hole transport layer, and a hole injection layer, for example. Formed on the organic EL layer 213 is an upper electrode 214 as the anode. The upper electrode 214 is formed with IZO (Indium Zinc Oxide), ITO (Indium Tin Oxide) or the like as a transparent conductive film. There are also cases where the upper electrode 214 is formed of a thin film of metal such as silver. The protective layer 215 is formed with SiNx or the like to cover the upper electrode 214, and the polarizing plate 220 for preventing the reflection is bonded onto the protective layer 215 by using an adhesive material 216.

While various types of TFTs such as drive TFTs and switching TFTs are formed in the TFT array layer, employing the present invention makes it possible to form LTPS TFTs and TAOS TFTs in a common process, and thus various combinations of LTPS TFTs and TAOS TFTs become usable. Accordingly, an organic EL display device excelling in the image quality and capable of reducing the electric power consumption can be realized.

While TAOS TFTs are used for the display region and LTPS TFTs are used for the peripheral drive circuit in the above description, it is also possible to add TAOS TFTs to the peripheral circuit or to add LTPS TFTs to the display region depending on the product specifications.

What is claimed is:

1. A display device comprising;
   a substrate having a display region in which pixels are formed and peripheral region in which a drive circuit is formed,
   a first thin film transistor having an oxide semiconductor layer, and
   a second thin film transistor having a silicon semiconductor layer,
   wherein
   the first thin film transistor is disposed in the display region,
   a first gate electrode of the first thin film transistor is arranged above the oxide semiconductor layer, a first insulating film is arranged between the oxide semiconductor layer and the first gate electrode, and includes a first gate insulating film and a second gate insulating film, a passivation film is formed above the first gate electrode and the first insulating film, a first electrode is connected to a drain of the first thin film transistor via a first through hole formed in the first insulating film and the passivation film, a second electrode is connected to a source of the first thin film transistor via a second through hole formed in the first insulating film and the passivation film, the first through hole and the second through hole are shaped rectangular in plan view, the second thin film transistor is disposed in the peripheral region, the second thin film transistor has a second gate electrode and a second insulating film, an interlayer insulation film is formed between the oxide semiconductor layer and the silicon semiconductor layer, a metal film under the first thin film transistor is formed on a same layer where the second gate electrode of the second thin film transistor is formed, and the metal film is overlapped the oxide semiconductor layer in plan view.

2. The display device according to claim 1, wherein the silicon semiconductor layer of the second thin film transistor is polysilicon.

3. The display device according to claim 1, wherein the interlayer insulation film includes a first interlayer insulation film and a second interlayer insulation film.

4. The display device according to claim 1, wherein the first insulating film is AlOx.

5. The display device according to claim 1, wherein the first gate insulating film is AlOx.

6. The display device according to claim 1, wherein
the second insulating film is formed on the silicon semiconductor layer,
the second gate electrode of the second TFT is formed on the second insulating film,
the silicon semiconductor layer is formed between the second insulating film and the substrate.

7. The display device according to claim 1, wherein the second insulation film overlap the oxide semiconductor layer.

* * * * *